(12) United States Patent
Yoshida

(10) Patent No.: US 8,796,374 B2
(45) Date of Patent: Aug. 5, 2014

(54) CONDITIONER FOR ELECTROLESS PLATING

(75) Inventor: Katsuhiro Yoshida, Niigata (JP)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 617 days.

(21) Appl. No.: 12/590,056

(22) Filed: Nov. 2, 2009

(65) Prior Publication Data

US 2010/0120962 A1    May 13, 2010

(30) Foreign Application Priority Data

Oct. 31, 2008  (JP) ................................. 2008-281399

(51) Int. Cl.
*C08K 3/28*  (2006.01)

(52) U.S. Cl.
USPC ........................................................ 524/428

(58) Field of Classification Search
USPC .......................................... 106/1.11; 524/428
See application file for complete search history.

(56) References Cited

U.S. PATENT DOCUMENTS

| | | | |
|---|---|---|---|
| 4,135,991 A | | 1/1979 | Canaris et al. |
| 4,515,829 A * | | 5/1985 | Deckert et al. ............... 427/97.2 |
| 4,717,460 A | | 1/1988 | Nobel et al. |
| 4,891,069 A * | | 1/1990 | Holtzman et al. ........... 106/1.15 |
| 5,250,105 A * | | 10/1993 | Gomes et al. ................ 106/1.11 |
| 6,146,700 A * | | 11/2000 | Yuan et al. .................... 427/304 |
| 6,565,731 B1 * | | 5/2003 | Couble et al. ................. 205/125 |
| 2006/0051610 A1 | | 3/2006 | Crosby |
| 2006/0257789 A1 * | | 11/2006 | Gries et al. .................... 430/302 |
| 2006/0264043 A1 * | | 11/2006 | Stewart et al. ................ 438/678 |

FOREIGN PATENT DOCUMENTS

| | | |
|---|---|---|
| EP | 0 248 683 | 12/1987 |
| EP | 1 754 805 | 2/2007 |
| GB | 2 253 415 | 9/1992 |

OTHER PUBLICATIONS

European Search Report of corresponding European Application No. 09 15 5657.

* cited by examiner

*Primary Examiner* — Doris Lee

(74) *Attorney, Agent, or Firm* — John J. Piskorski

(57) ABSTRACT

A conditioner, surface treatment method, and metal plating film forming method for a moist method of providing a plating film with strong adhesion towards a surface with low roughness without forming a metal film or performing an adhesion promoter pretreatment using a wet method, when plating a resin substrate containing a blend of resin material and glass material, and the like.

5 Claims, 3 Drawing Sheets

CONDITIONER FOR ELECTROLESS PLATING

The present invention relates to a conditioner that is used as a pretreatment for electroless metal plating for resin substrate, and particularly for printed wiring boards, and also relates to a surface treating method and a method of forming a metal plating film that uses this conditioner.

Electrical connections between layers on a printed wiring board are generally performed via very small holes known as through-holes. As a method of forming a conductive film in these through-holes (glass cloth/resin part), a wet method of pre-treating with a conditioner primarily containing a cationic surfactant, applying a catalyst primarily containing palladium, and then forming a plating film by an electroless plating method is generally used. Furthermore, with a high-density printed wiring board represented by a high performance semiconductor package substrate, a buildup method that uses a functional insulative resin material is used, and as the method of forming the wiring, an additive method, and particularly a semi-additive method where electroless copper plating is used as a seed layer is widely used.

Generally, in order to increase the adhesion between a resin substrate and a conductive film, with a wet method, a resin-swelling process using a treatment solution containing primarily solvent is performed, and then the resin is subjected to oxidative decomposition using a roughening process that uses a treatment solution primarily containing a permanganate salt to make a rough form, and then an anchor is formed in a series of de-smear/roughening processes that remove the manganese by a neutralization process. Next, conditioning is performed using a conditioner, a catalyst application process is performed, and then electroless plating is performed to form a conductive film with adhesion. As the catalyst for electroless plating, palladium which has excellent catalytic activity is widely used, and an Sn/Pd mixture colloid is made to adhere to the resin substrate surface by immersing the resin substrate in a catalyst solution (Sn/Pd mixture colloid) combo and then catalyst activation is performed using an accelerator process to form a conductive film on the resin substrate surface by electroless plating.

However, with a method that provides adhesion primarily by an anchor effect, if the degree of roughness of the resin substrate surface is reduced, the adhesion between the substrate and the metal film will be lower, and obtaining a plating film with high adhesion will be difficult. Furthermore, the adhesion is also strongly affected by the type of acid, alkali, and cationic surfactant that make up the conditioner, as well as the type of resin material, and the like. In particular, with a high performance semiconductor package, high-speed signaling and high frequencies are proceeding in conjunction with the increase in IC chip performance, and a wiring form which has a flat surface and detailed wiring which includes the package substrate is required, but with the electroless copper plating method which is a conventional semi-additive method, forming a conductive film with higher deletion on a low roughness surface is difficult, and there is a limit to the flatness of the material surface. Because of this background, there is a strong desire for development of a surface-treating method and electroless plating process that can provide strong adhesion between the substrate and metal film without being affected by the resin material and the surface roughness of the resin.

Japanese unexamined patent application 2003-338683 discloses a manufacturing method for a wiring board comprising a hydrophilizing process such as a plasma treatment, or the like, on a surface with a conductor pattern on a resin layer containing an electrically insulative resin containing a particulate component such as $SiO_2$ particles, or the like, a glass-etching process that removes the particulate component present near the surface with the conductor pattern by bringing in contact with a hydrofluoric acid compound, and a step of forming a metal layer with a prescribed thickness by electroless plating or electroplating. However, with the method of Japanese unexamined patent application 2003-338683, plasma treatment, ozone treatment, or corona discharge treatment, or the like, is necessary for hydrophilizing, and specialized equipment is required.

Japanese examined patent application H6-505770 discloses a solution for conditioning, comprising (a) between approximately 10 and approximately 50 g/L of sodium polyphosphate, (b) between 0 and approximately 5 g/L of Na-EDTA, (c) between approximately 5 and approximately 20 g/L of tripotassium phosphate, (d) between 0.5 and approximately 2 g/L of Antarox BL300, (e) between 0 and approximately 2 g/L of Synperonic NP-10, (f) between approximately 1 and approximately 5 g/L of a quaternary ammonium compound which is fundamentally a derivative of imidazole, and (g) between 0 and approximately 2 g/L of ammonium difluoride; wherein the pH is adjusted using an inorganic acid to be in a range between approximately 1.0 and approximately 4.0, and the substrate is cleaned before coating a non-metal substrate with a metal coating. However, with Japanese examined patent application H6-505770, the focus is not on adhesion, and as shown in the comparative example below, the adhesion is insufficient even when the amount of ammonium hydrogen difluoride shown in Japanese examined patent application H6-505770 is added.

Japanese unexamined patent application 2002-38197 discloses a composition for removing a polymer substance from a substrate, comprising one or more polyol compound, one or more glycol ether, water, a fluoride, and arbitrary additives. However, Japanese unexamined patent application 2002-38197 does not disclose a conditioner or a method of treating a printed wiring board according to the present invention.

An objective of the present invention is to provide a conditioner, surface-treatment method, and metal plating film forming method for a moist method of providing a plating film with strong adhesion towards a surface with low roughness without forming a metal film or performing an adhesion promoter pretreatment using a wet method, when electroless plating a resin substrate containing a blend of resin material and glass material, and the like.

In order to achieve the aforementioned objective, the present inventors discovered that the aforementioned problems can be resolved by adding a prescribed amount of ammonium hydrogen difluoride to a conditioner containing cationic polymer, chelating agent, nonionic surfactant, and water, and have thus achieved the present invention.

The present invention provides a conditioner used as a pretreatment solution for electroless plating a surface of a resin substrate, comprising: cationic polymer, nonionic surfactant, and water; and further comprising between 5 and 200 g/L of a ammonium hydrogen bifluoride. The conditioner can also contain a chelating agent. In addition, the resin substrate can be a printed wiring board, and the printed wiring board can have through-holes, blind via, or both. Furthermore, the present invention provides a method of treating the surface of a resin substrate by treating the surface of a resin substrate with the aforementioned conditioner.

Figure 1:
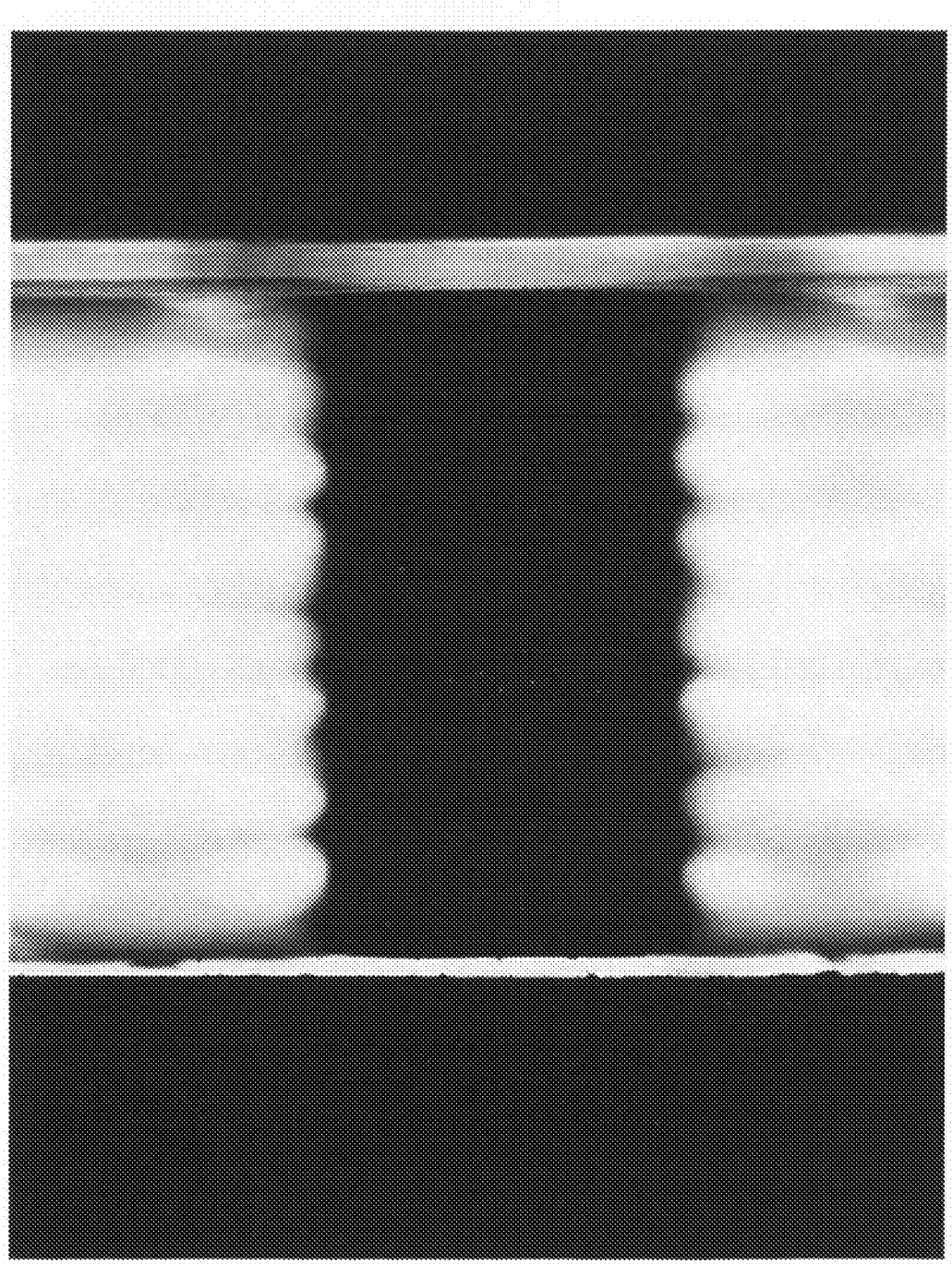
FIG. 1 is a photograph showing the chemical copper throwing power in through-holes for the case where a conditioner prepared in Embodiment 11 is used.

The abbreviations used throughout this specification have the following meanings unless otherwise designated.

g=gram; mg=milligram; °C.=degrees Celsius; m=meter; cm=centimeter; μm=micrometer, nm=nanometer, L=liter; mL=milliliter; $dm^2$=square decimeters; mol=moles; N=Newtons. The range of all values includes the boundary values, and may be combined in any order.

The conditioner of the present invention contains cationic polymer, nonionic surfactant, and water; and also contains between 5 and 200 g/L of a ammonium hydrogen bifluoride.

Ammonium hydrogen difluoride is the compound expressed by $NH_4F.HF$. The conditioner of the present invention contains ammonium hydrogen difluoride in a range between 5 and 200 g/L, preferably in a range between 5 and 50 g/L, and more preferably in a range between 7.5 and 15 g/L. If the amount of ammonium hydrogen difluoride is less than 5 g/L, the adhesion will be insufficient as shown by the comparative example below, which is not preferable. Furthermore, if the amount exceeds 200 g/L, the nonionic surfactant will not easily dissolve in the conditioner which is not preferable.

The conditioner of the present invention contains a cationic polymer as an essential component. The cationic polymer can also be called a cationic surfactant, and is a surfactant that disassociates in water to form an organic cation, and functions in the conditioner by providing a positive electric charge to neutralize the electric charge on the surface of the resin substrate. The molecular weight of the cationic polymer is preferably between approximately 300 and 1000. Preferable examples of the cationic polymer include macromolecular quaternary amine compounds such as quaternary salts of amine compounds such as polydiaminodimethyl ammonium salts, polydiaryl dialkyl ammonium salts, and quaternary salts of polyvinylpyridine, polyacrylamide, polyethyleneimine, and the like, and of these, polydiaryldimethyl ammonium chloride, polydiaryldimethyl ammonium chloride/acrylamide copolymer, and polyethyleneimine are particularly preferable. The amount of cationic polymer added is preferably between 0.5 and 2.0 g/L, and more preferably between 0.5 and 1.0 g/L.

The conditioner of the present invention contains a nonionic surfactant as an essential component. The nonionic surfactant is also referred to as a nonion surfactant, and is a surfactant that does not have ionic properties, and functions to reduce the surface tension of the conditioner solution and to function as a dispersing agent for the cationic polymer in the conditioner. Examples of preferable nonionic surfactants include polyoxyethylene alkyl ethers, polyoxyethylene octylphenyl ethers, polyoxyethylene nonylphenyl ethers and other polyoxyethylene derivatives, as well as polyethylene glycol, and alkyl alcohol ethoxylates. The amount of nonionic surfactant added to the conditioner solution is preferably between 1 and 10 g/L, more preferably between 1 and 5 g/L.

The condition of the present invention can also contain a chelating agent. The chelating agent is a chemical that has a plurality of donor atoms that bond with metal ions to form chelation compounds, and functions by forming a chelation compound with the metal ions that are dissolved in the conditioner solution during conditioning. Preferable examples of chelating agents include monoalkylamines such as monomethanolamine, monoethanolamine, monopropanolamine, and isopropanolamine; dialkylamines, triethanolamine, tributanolamine, other trialkylamines, ammonia, and ethylene diamine tetraacetate (EDTA), and of these compounds, monoethanolamine, triethanolamine, isopropylamine, and ammonia are particularly preferable. Note, the pH of the conditioner varies depending on the type and amount of chelating agent. The amount of chelating agent added is preferably between 2.0 and 20 g/L, and more preferably between 2.0 and 15 g/L.

If necessary, the conditioner of the present invention can also contain standard additives such as pH-adjusting agents, and the like, as additional arbitrary components.

The conditioner of the present invention can be used as a pretreatment solution for electroless plating the surface of a resin substrate. The resin substrate can be a printed wiring board, and the printed wiring board can be a substrate with small non-penetrating holes known as blind via and small penetrating holes known as through-holes, and can have a glass cloth/resin part. Furthermore, with a high-density printed wiring board represented by high-performance semiconductor package boards, a functional insulative resin material board is used as the resin substrate. In this specification, the "surface" of a printed wiring board includes the inside wall surface of holes if holes such as through-holes exist in the substrate.

Examples of the resin substrate included substrates made from epoxy resin, cyanate resin, bismaleimide.triazine resin, polyamide, ABS, polyphenyl ether, polysulfone, fluorine resin, polycarbonate, polyacetal, polyphenylene oxide, polypropylene, and liquid crystal polymer, and the like.

The present substrate treatment that uses the conditioner of the present invention is performed by an arbitrary method that brings the conditioner into contact with the resin substrate. For example, the treatment can be performed by immersing in the conditioner an object for treatment which has undergone a so-called desmearing or roughening process if necessary, or spraying the conditioner on the object for treatment. After pre-treating with the conditioner, the printed wiring board can be plated by a standard electroless plating process. For example, after pretreatment with the conditioner, the printed wiring board can pass through a catalyzing process that causes a catalyst to be adsorbed onto the surface of the resin substrate, be subjected to catalytic activation using an arbitrary accelerator treatment, and then electroless plated on the surface of the resin substrate in order to form a conductive film with strong adhesion. In this case, the catalyst for electroless plating is preferably a catalyst with excellent catalytic activity, and for example, can be a catalyst that contains palladium.

The following method can be suggested as an example of electroless copper plating using the surface treatment method for the conditioner of the present invention.

First, a resin substrate is immersed for 5 minutes in the conditioner of the present invention which has been heated to 45° C. in order to prepare the surface for applying a catalyst to the surface of the object for treatment. The surface of the resin substrate is soft etched for 1 minute using sodium persulfate at a temperature of 30° C., the surface is acid washed for 1 minute at room temperature, and then the smut salt that is formed is removed by etching. Next, the object for treatment is immersed for 4 minutes in a Sn.Pd colloid catalyst solution at 45° C., for example, to form a catalyst on the surface of the object for treatment. Furthermore, catalyst activation that removes the Sn, and the like, and metallizes the Pd is performed by immersing in an accelerator solution at room temperature for 5 minutes. The catalyst activated object for treatment is electroless plated by standard method such as electroless copper plated for 20 minutes at 25° C. to form a conductive film on the object for treatment.

Next, the present invention will be described in detail by presenting embodiments and comparative examples. The adhesion strength and surface roughness of the embodiments and the comparative examples were evaluated as shown below.

(1) Adhesion Strength

The surface of the plated material with the copper plating film that was obtained is water washed with the ionized water for 3 minutes at room temperature, dried by heating (120° C., 30 minutes), the surface of the plated material was immersed in acid cleaner (liquid temperature of 35° C., 2 minutes) containing sulfuric acid, and then copper electroplating was performed by electrolytic copper plating (Electroposit EP1100). The surface of the plated material that was obtained was water washed with deionized water at room temperature for 3 minutes, and then heated and dried (180° C., 60 minutes). The copper plating film obtained had a film thickness between 20 and 25 µm, and this plating film was cut in 1 cm widths, and the adhesion strength between the substrate resin and the plating film was measured using an INSTON-5564 tester at a tensile speed of 50 mm/minute and at an angle of 90° in accordance with the printed wiring board test method JIS C 5012.

(2) Surface Roughness (Ra)

The object for treatment was immersed in a resin-swelling solution (Circuposit MLB211) primarily containing solvent at a liquid temperature between 70° C. and 80° C. for between 5 and 10 minutes, a rough form was created by immersing in a solution (Circuposit MLB213) primarily containing a permanganate salt at a liquid temperature between 70° C. and 80 C.° for between 5 and 20 minutes, the manganese was removed by immersing in a neutralizing solution (Circuposit MLB 216-5) at a liquid temperature of 45° C. for between 5 and 10 minutes, and then the surface roughness (Ra) of the object for treatment was measured using a surface treatment-measuring device WYKO NT8000.

Embodiments 1 through 10

The following resin substrates 1 through 3 were used as the resin substrate of the object for treatment.

| Resin substrates | |
| --- | --- |
| Resin substrate 1 | Ra: Between 590 and 630 (nm) |
| Resin substrate 2 | Ra: Between 480 and 500 (nm) |
| Epoxy resin substrate 3 | Ra: Between 900 and 1000 (nm) |

Conditioner baths were prepared using the following conditioner concentrates (A) through (D) containing a bionic polymer, chelating agent, nonionic surfactant, and water, by adding the various compounds at the ratios shown in Tables 1 and 2. The resin substrates 1 through 3 were subjected to a desmearing/roughening process using a permanganate salt, and then immersed in the conditioner shown in Table 6 at a temperature of 45° C. for 5 minutes. Next, soft etching was performed using sodium persulfate, and after washing with acid, a catalyzing process was performed using a Sn.Pd mixed colloid (Cataposit 44 catalyst), catalytic activation was performed using an accelerator solution (Accelerator 19E), and then electroless copper plating was performed by immersing in an electroless copper plating solution (Cuposit 328 copper mix concentrate) at a temperature of 25° C. for 20 minutes. Next, copper electroplating was performed and then an adhesion test was performed. The evaluation results are also shown in Table 1 and Table 2.

Conditioner Concentrate (All conditioner concentrates are manufactured by Rohm and Haas Company. Each contains cationic polymer, chelating agent, nonionic surfactant, and water.)
(A) Conditioner Neutralizer 3320
(B) Conditioner 231
(C) Circuposit 860
(D) Cleaner Conditioner XP2285

TABLE 1

| | Embodiment 1 | Embodiment 2 | Embodiment 3 | Embodiment 4 |
| --- | --- | --- | --- | --- |
| Resin substrate | Resin substrate 1 | Resin substrate 1 | Resin substrate 2 | Epoxy resin substrate 3 |
| Type of conditioner concentrate | A | D | A | D |
| NH$_4$F•HF (g/L) | 11.4 | 11.4 | 11.4 | 11.4 |
| pH | 4.04 | 4.85 | 4.07 | 4.85 |
| Peel strength (N/m) | 673 | 689 | 1067 | 795 |

TABLE 2

| | Embodiment 5 | Embodiment 6 | Embodiment 7 | Embodiment 8 | Embodiment 9 | Embodiment 10 |
| --- | --- | --- | --- | --- | --- | --- |
| Resin substrate | Resin substrate 1 | Resin substrate 1 | Resin substrate 1 | Resin substrate 1 | Resin substrate 1 | Resin substrate 1 |
| Type of conditioner concentrate | A | D | A | D | A | D |
| NH$_4$F•HF (g/L) | 5 | 5 | 10 | 10 | 15 | 15 |
| pH | 3.15 | 5.54 | 3.78 | 5.39 | 4.11 | 4.77 |
| Peel strength (N/m) | 662 | 671 | 652 | 704 | 704 | 682 |

Comparative Examples 1 through 16

Conditioners were prepared similar to Embodiment 1, except that the 11.4 g/L (0.2 mol/L) of ammonium hydrogen difluoride was substituted with the compounds shown in Tables 3, 4 and 5, and then electroless copper plating was performed by the same operation as Embodiment 1. The test results are also shown in Tables 3, 4 and 5. Note, Comparative Examples 13 through 16 had the pH adjusted using sulfuric acid or sodium hydroxide.

Furthermore, from Comparative Examples 13 through 16, it can be seen that strong adhesion cannot be obtained even when the pH of the conditioner is similar to that of the embodiments, if other compounds are added in place of the ammonium hydrogen disulfide. Furthermore, by comparing Embodiment 5 to Comparative Example 6 and Embodiment 7 to Comparative Example 8, it can be seen that the adhesion will be inferior if the amount of ammonium hydrogen difluoride is less than 5 g/L.

TABLE 3

|  | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|
| Resin substrate | Resin substrate 1 | Resin substrate 1 | Resin substrate 1 | Resin substrate 1 | Resin substrate 2 | Epoxy resin substrate 3 | Resin substrate 1 | Resin substrate 1 |
| Type of conditioner concentrate | A | B | C | D | A | D | A | D |
| $NH_4F \cdot HF$ (g/L) | 0 | 0 | 0 | 0 | 0 | 0 | 2.5 | 2.5 |
| pH | 2.05 | 11.41 | 9.96 | 11.21 | 2.05 | 11.21 | 2.82 | 8.11 |
| Peel strength (N/m) | 599 | 568 | 537 | 606 | 916 | 718 | 613 | 630 |

TABLE 4

|  |  | Comparative Example 9 | Comparative Example 10 | Comparative Example 11 | Comparative Example 12 |
|---|---|---|---|---|---|
| Resin substrate |  | Resin substrate 1 | Resin substrate 1 | Resin substrate 1 | Resin substrate 1 |
| Type of conditioner concentrate |  | A | A | A | A |
| Additive (mol/L) | NaF | 0.2 |  |  |  |
|  | $NH_4Cl$ |  | 0.2 |  |  |
|  | $NH_3$ |  |  | 0.2 |  |
|  | NaBr |  |  |  | 0.2 |
| pH |  | 4.19 | 2.28 | 3.77 | 2.26 |
| Peel strength |  | 629 | 579 | 614 | 629 |

TABLE 5

|  |  | Comparative Example 13 | Comparative Example 14 | Comparative Example 15 | Comparative Example 16 |
|---|---|---|---|---|---|
| Resin substrate |  | Resin substrate 1 | Resin substrate 1 | Resin substrate 1 | Resin substrate 1 |
| Type of conditioner concentrate |  | A | A | A | A |
| Additive (mol/L) | NaF | 0.2 |  |  |  |
|  | $NH_4Cl$ |  | 0.2 |  |  |
|  | $NH_3$ |  |  | 0.2 |  |
|  | NaBr |  |  |  | 0.2 |
| pH |  | 4.25 | 4.13 | 4.13 | 4.17 |
| Peel strength |  | 603 | 518 | 572 | 601 |

From these embodiments, it can be seen if the conditioner of the present invention is used, achieving strong adhesion is not dependent on the roughness of the resin substrate or the type of conditioner concentrate. Furthermore, by comparing Embodiment 1 with Comparative Example 1 and Comparative Examples 9 through 12, a conditioner containing ammonium hydrogen difluoride will have stronger peel strength and stronger adhesion than when ammonium hydrogen difluoride is not added (Comparative Example 1) or when other compounds are added (Comparative Examples 9 through 12).

Embodiments 11 through 13

Figure 2:
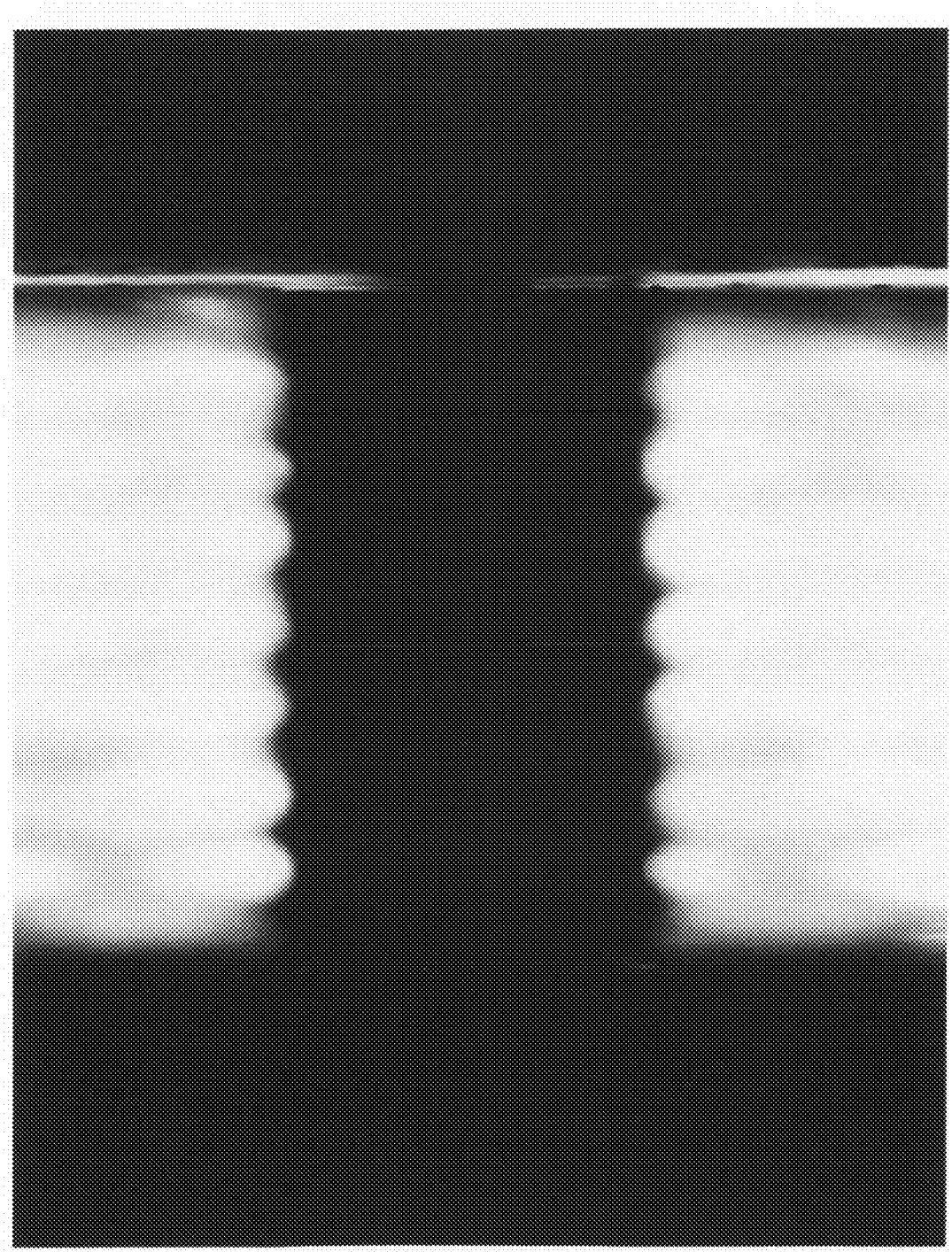
FIG. 2 is a photograph showing the chemical copper throwing power in through-holes for the case where a conditioner prepared in Embodiment 12 is used.
Figure 3:
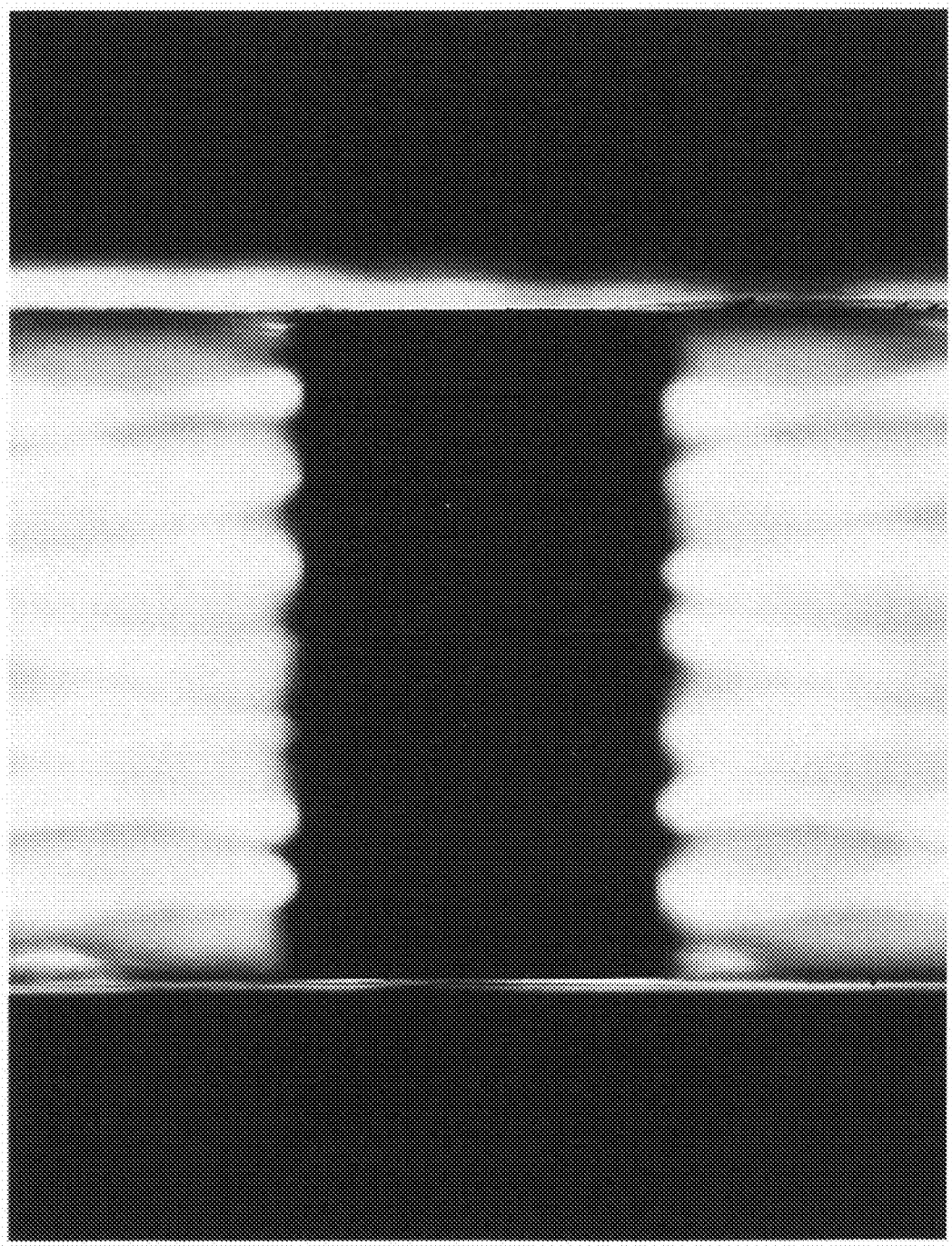
FIG. 3 is a photograph showing the chemical copper throwing power in through-holes for the case where a conditioner prepared in Embodiment 13 is used.

Conditioner baths were prepared by adding various compounds in the amounts shown in Table 6. Electroless copper plating was performed by the same operation as Embodiment 1, except that a board containing through-holes was used as the object for treatment. Next, the through-holes substrate was polished and the chemical copper throwing power in the through-holes was observed by the back light method. The results are shown in FIG. 1 through 3.

TABLE 6

|  | Embodiment 11 | Embodiment 12 | Embodiment 13 |
|---|---|---|---|
| Conditioner concentrate | B | C | D |
| Additive (mol/L) NH$_4$F•HF | 0.2 | 0.2 | 0.2 |

From Embodiments 11 through 13, it can be seen that plating was performed without problems even when the conditioner of the present invention was applied to a substrate with through-holes.

What is claimed is:

1. A method comprising:
  a) providing a substrate containing a resin;
  b) contacting the resin with a conditioner comprising a cationic polymer, a nonionic surfactant, a chelating agent chosen from monoalkylamines, dialkylamines and trialkylamines and between 5 and 200 g/L of ammonium bifluoride;
  c) contacting the resin with a catalyst; and
  d) contacting the resin with an electroless cooper plating bath to electrolessly plate copper on the resin of the substrate.

2. The method of claim 1, wherein the monoalkylamines are chosen from monomethanolamine, monoethanolamine, monopropanolamine and isopropanolamine.

3. The method of claim 1, wherein the trialkylamines are chosen from triethanolamine and tributanolamine.

4. The method of claim 1, wherein the resin is chosen from epoxy resin, cyanate resin, bismaleimide triazine resin, polyamide, ABS, polyphenyl ether, polysulfone, fluorine resin, polycarbonate, polyacetal, polyphenylene oxide and polypropylene.

5. The method of claim 1, wherein the substrate is a printed wiring board.

* * * * *